United States Patent
Liebregts et al.

(10) Patent No.: US 11,561,480 B2
(45) Date of Patent: Jan. 24, 2023

(54) SYSTEM AND METHOD FOR INSPECTING A WAFER

(71) Applicant: ASML NETHERLANDS B.V., Veldhoven (NL)

(72) Inventors: Ivo Liebregts, Waalre (NL); Niladri Sen, San Jose, CA (US); Koen Thuijs, Vught (NL); Ronaldus Johannes Gysbertus Goossens, Los Altos, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/712,397

(22) Filed: Dec. 12, 2019

(65) Prior Publication Data
US 2020/0209761 A1 Jul. 2, 2020

Related U.S. Application Data

(60) Provisional application No. 62/784,883, filed on Dec. 26, 2018.

(51) Int. Cl.
*G03F 7/20* (2006.01)

(52) U.S. Cl.
CPC .................................. *G03F 7/7065* (2013.01)

(58) Field of Classification Search
CPC ............... G03F 7/7065; G03F 7/70508; G03F 7/70533; G03F 7/70616; H01L 22/12
See application file for complete search history.

(56) References Cited

U.S. PATENT DOCUMENTS

| | | |
|---|---|---|
| 9,507,907 B2 | 11/2016 | Fouquet et al. |
| 9,990,451 B2 | 6/2018 | Hunsche et al. |
| 2007/0048635 A1 | 3/2007 | Schulze et al. |
| 2009/0257034 A1 | 10/2009 | Kuit et al. |
| 2010/0030360 A1 | 2/2010 | Habets et al. |
| 2015/0356233 A1 | 12/2015 | Fouquet et al. |
| 2017/0357911 A1* | 12/2017 | Liu ........................ G06N 20/10 |
| 2018/0314149 A1* | 11/2018 | Mulkens ............... G03F 7/7065 |
| 2019/0072505 A1* | 3/2019 | Saraswatula ............ H01J 37/28 |
| 2020/0159124 A1* | 5/2020 | Wang .................. G03F 7/70616 |

OTHER PUBLICATIONS

"Defect Prediction" Research Disclosure, Kenneth Mason Publications, vol. 604, No. 33, Jul. 18, 2014.
International Search Report issued in corresponding PCT Patent Application No. PCT/EP2019/083973, dated Feb. 26, 2020.

* cited by examiner

*Primary Examiner* — Deoram Persaud
(74) *Attorney, Agent, or Firm* — Pillsbury Winthrop Shaw Pittman LLP

(57) ABSTRACT

A computer-implemented defect prediction method for a device manufacturing process involving processing a pattern onto a substrate. Non-correctable error is used to help predict locations where defects are likely to be present, allowing improvements in metrology throughput. In an embodiment, non-correctable error information relates to imaging error due to limitations on, for example, the lens hardware, imaging slit size, and/or other physical characteristics of the lithography system. In an embodiment, non-correctable error information relates to imaging error induced by lens heating effects.

20 Claims, 3 Drawing Sheets

SYSTEM AND METHOD FOR INSPECTING A WAFER

This application claims the benefit of priority of U.S. patent application No. 62/784,883, filed on Dec. 26, 2018, which is incorporated herein in its entirety by reference.

FIELD

The present description relates to a method of optimizing the performance of semiconductor manufacturing process. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

In an aspect, there is provided a method for predicting a defect location for subsequent scanning by a scanning electron microscope (SEM), the method including obtaining non-correctable error information, the non-correctable error information being based on data from a photolithography system used to image a wafer to be scanned by the SEM, predicting a defect location on the wafer based on the non-correctable error information, and sending the predicted defect location for delivery to the SEM.

In an aspect, there is provided a method for predicting a defect location for subsequent scanning by a scanning electron microscope (SEM), the method including predicting optical imaging effects of heating on optical elements of the projection optical system using a computational projection optical system heating model, predicting a defect location using a defect detection algorithm, using the predicted heating effects as an input, and sending the predicted defect location for delivery to the SEM.

In an aspect, there is provided a method for inspecting a wafer having an image produced with a photolithography system including a projection optical system includes obtaining non-correctable error information from the photolithography system, predicting imaging errors using a defect detection algorithm, using the non-correctable error information as an input, using the predicted imaging errors to determine areas of the wafer to be inspected, and inspecting the determined areas.

In an aspect, there is provided a method for inspecting a wafer having an image produced with a photolithography system including a projection optical system includes predicting optical imaging effects of heating on optical elements of the projection optical system using a computational projection optical system heating model, predicting imaging errors using a defect detection algorithm, using the predicted heating effects as an input, using the predicted imaging errors to determine areas of the wafer to be inspected, and inspecting the determined areas.

In an aspect, there is provided a system for inspection of a wafer having an image produced with a photolithography system including a projection optical system, the system including: a module configured and arranged to obtain non-correctable error information from the photolithography system, a prediction module configured and arranged to predict imaging errors using a defect detection algorithm, using the non-correctable error information as an input, and an inspection tool configured and arranged to inspect the wafer using the predicted imaging errors to determine areas of the wafer to be inspected.

According to an embodiment, the method further comprises identifying one or more processing window limiting patterns (PWLPs) from the patterns.

According to an embodiment, the defect is a defect produced from at least one of the PWLPs.

According to an embodiment, a characteristic of the substrate or the die is a process window of at least one of the PWLPs.

According to an embodiment, the lithographic process comprises a device manufacturing process involving processing a pattern onto a substrate.

In an aspect, there is provided a computer program product comprising a computer readable medium having instructions therein, the instructions when executed by a computer implementing any part of the methods herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
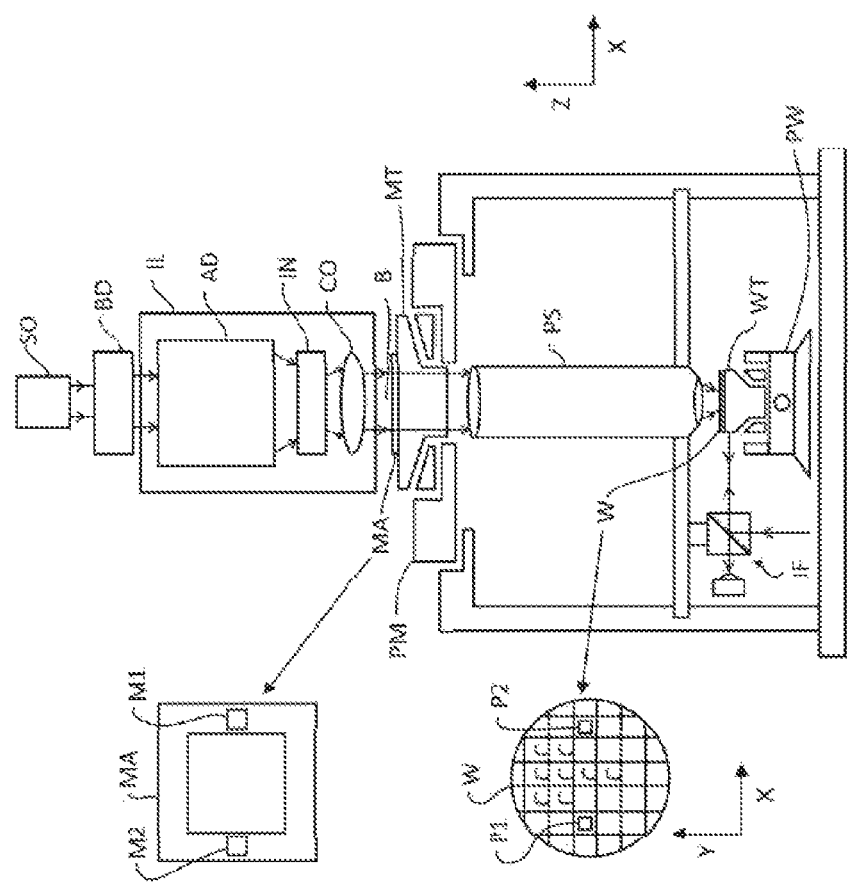
FIG. 1 depicts a lithographic apparatus according to an embodiment of the invention.
Figure 3:
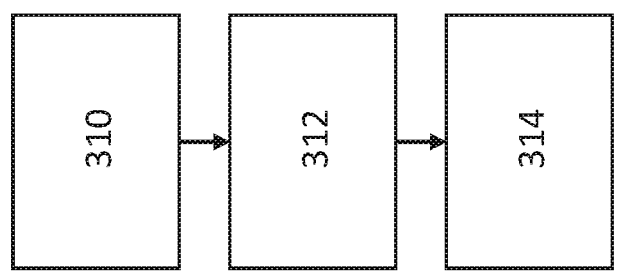
FIG. 3 shows a flow chart for a machine learning algorithm in accordance with an embodiment.

Computing power of electronic devices has followed a pattern of increased power and reduced physical size over the years. This has been achieved by increasing the number of circuit components (transistors, capacitors, diodes, etc.) on each integrated circuit (IC) chip. For example, an IC chip in a smart phone, can be as small as a person's thumbnail, and may include over 2 billion transistors, the size of each transistor being less than 1/1000th the size of a human hair. Making an IC is a complex and time-consuming process, with circuit components in different layers and including hundreds of individual steps. Errors in even one step have the potential to result in problems with the final IC. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

A corresponding difficulty that is in conflict with high yield is the goal of maintaining a fast production schedule (known as throughput, or the number of wafers processed per hour, for example). High process yield and high wafer throughput can be impacted by the presence of defects, especially if operator intervention is required for reviewing the defects. Thus, high throughput detection and identification of tiny defects by inspection tools (such as an optical or electron microscope (SEM)) is essential for maintaining high yield and low cost.

Because the microscopes used for defect detection can only see a small part of the wafer at a time, defect detection can be very time consuming, reducing overall throughput. For example, if every location on a wafer had to be inspected to find defects, wafer throughput could be significantly reduced, as the time it would take to inspect every location on every IC on a wafer would be very long. One approach to this problem is to make use of techniques that predict a defect location based on information obtained from a photolithography system, which is a system used in the manufacture of IC chips. In an example, rather than inspecting every location on a wafer to find defects, the predicted locations are inspected, resulting in a significantly reduced number of locations that need to be inspected and a corresponding reduction in inspection time and increase in wafer throughput.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

FIG. 1 schematically depicts a lithographic apparatus according to a particular embodiment of the invention. The apparatus comprises:

- an illumination system (illuminator) IL to condition a beam PB of radiation (e.g. UV radiation or DUV radiation).
- a support structure MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basic functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithographic apparatus LA. Using a computational lithography technique, the patterning device MA may be designed to at least partially correct for apodizations.

Various patterns on a patterning device may have different process windows (i.e., a space of processing parameters under which a pattern will be produced within specifications). Examples of pattern specifications that relate to potential systematic defects include checks for necking, line pull back, line thinning, CD, edge placement, overlapping, resist top loss, resist undercut and bridging. The process window of all the patterns on a patterning device may be obtained by merging (e.g., overlapping) process windows of each individual pattern. The boundary of the process window of all the patterns contains boundaries of process windows of some of the individual patterns. In another word, these individual patterns limit the process window of all the patterns. These patterns can be referred to as "hot spots" or "process window limiting patterns (PWLPs)," which are used interchangeably herein. When controlling a lithography process, it is possible and economical to focus on the hot spots. When the hot spots are not defective, it is most likely that the all the patterns are not defective.

Processing parameters may vary with position on a substrate and with time (e.g., between substrates, between dies). Such variation may be caused by change in the environment such as temperature and humidity. Other causes of such variations may include drift in one or more components in the processing apparatus such as the source, projection optics, substrate table, height variations of substrate surfaces, etc. in a lithography apparatus. It would be beneficial to be aware of such variations and their effects on PWLPs or potential patterning defects, and to adjust the lithography process to accommodate such variations so as to reduce actual defects. To reduce the computational cost of track these variations, one can again monitor only the hot spots.

Figure 2:
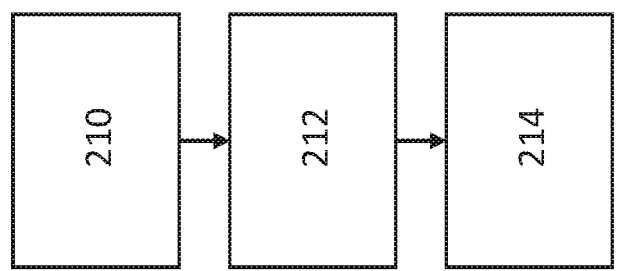
FIG. 2 shows a flow chart for a method of inspecting a wafer having an image produced with a photolithography system including a projection optical system, according to an embodiment.

FIG. 2 shows a flow chart for a method of inspecting a wafer having an image produced with a photolithography system including a projection optical system, according to an embodiment. The photolithography system produces images on a wafer containing patterns that eventually are used to form integrated circuit elements. The details of the imaging are discussed in more detail above in relation to FIG. 1, but in brief, the radiation beam PB is either transmitted through or reflected off of the patterning device (e.g. mask) MA, producing a patterned beam of radiation. The patterned beam is projected and focused onto a target portion C of the substrate W to produce an image in a chemical resist which can then be developed and further processed to produce the final pattern to be used in the IC. In step 210, non-correctable error information is obtained from the photolithography system. Generally, lithography systems are able to be adjusted in order to reduce certain sources of error. For example, where the wafer is topologically uneven, the wafer levelling system can allow for height differences. A wafer map is used to generate location setpoints whereby the wafer state may be controlled to improve focus performance in a feedback or feedforward control loop. However, because the imaging slit has finite size some types of topography cannot be accounted for. This non-level-able residual is called non-correctable error (NCE). During a scanned exposure, the non-correctable error changes continuously as the slit is scanned over a particular position on the wafer. The lithographic apparatus in accordance with an embodiment is capable of outputting NCE information for use by other systems.

While a modern lithography system has many tools for fine-tuning imaging parameters such as focus, dose, dynamics and lens aberrations, there tends to always be some amount that cannot be corrected. Due to hardware limitations of the projection lens, a lens NCE results from these issues and can be provided to a defect detection algorithm and be translated into CD and edge placement error (EPE) predictions.

In step 212, potential defect locations, in particular defects that result from imaging errors, are predicted using a defect detection algorithm, and using various NCE sources as inputs. Different approaches are available for defect prediction and detection. In one approach, hot spots can be identified by analyzing patterns using an empirical model or a computational model. In an empirical model, images (e.g., resist image, optical image, etch image) of the patterns are not simulated; instead, the empirical model predicts defects or probability of defects based on correlations between processing parameters, parameters of the patterns, and the defects. For example, an empirical model may be a classification model or a database of patterns prone to defects. In a computational model, a portion or a characteristic of one or more images is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding two features on separate layers that undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. The defects may include those defects that cannot be detected in an after-development-inspection (ADI) (usually optical inspection), such as resist top loss, resist undercut, etc. Conventional inspection only reveals such defects after the substrate is irreversibly processed (e.g., etched, ion implanted), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific possible defect using a more accurate inspection method (and typically more time consuming) to determine whether the defect needs rework, or it may be decided to rework the imaging of the specific resist layer (remove the resist layer having the resist top loss defect and recoat the wafer to redo the imaging of the specific layer) before the irreversible processing (e.g., etching) is done.

In principle, the NCE may be transmitted directly from the lithography system, or may pass through one or more intermediate systems for use by the SEM. That is, there may be one or more computers that perform the processing of the information in accordance with the defect detection algorithm, or the SEM may include the necessary processing capabilities. Likewise, the SEM and lithography system may be mutually incorporated together in an interconnected tool cluster. Thus, sending the predicted defect information for delivery to and use by the SEM need not be a direct sending, nor must the information arrive at the SEM in the form in which it leaves the lithography system, but rather may have been further processed. The information may be sent via a transmission system including a signal source, and transmission lines such as a bus, wired or wireless transmission, cable, optical fiber, or any other type of transmission line.

In an embodiment, a computing device is programmed with machine executable instructions in the form of a module for obtaining non-correctable error information from a photolithography system. This may be, for example, a communications bus or other transmission or receiving hardware that receives the information from the photolithography system and may comprise a prediction module implemented in a processor that is programmed to perform the defect determination algorithm.

By providing NCE information, portions of the wafer that are known to have potential defects (because they are known to have focus issues due to being unable to be fully levelled, for example) are identified. Thus, these portions of the wafer are good candidates for hot spots. By integrating the NCE information with other information, it may be possible to identify portions that have NCE issues, but are otherwise non-critical (e.g., wider lines) so that those portions do not have to be treated as hot spots. Once the hot spots are identified, they may be inspected 214 using a metrology tool—for example a high resolution electron beam tool.

In an embodiment, another source of NCE is the effect of lens heating. During imaging, some portion of the energy from the radiation is attenuated in the optical elements of the lenses. This means that they will tend to heat up, and therefore be subject to changes in optical properties (e.g., refraction and expansion), affecting the light path through the optical system, thereby affecting image quality. For some systems, there is a feedforward correction to address lens heating issues. For others, however, CD and edge placement errors can occur depending on the mask structures, the aberration sensitivities of these mask structures to the illumination source used, and the heat load.

A computational model may be used to address this type of NCE. The lens heating effects can be modelled, and the resulting computed lens heating NCE can be provided as an input to the defect detection algorithm.

While it is typical to collect NCE by lots, in an embodiment, NCE information is obtained for each exposure. Where lot information provides an average over many wafers, it may be useful to use the information from each exposure to help isolate possible hot spots in accordance with an embodiment. Likewise, field-to-field variation can be taken into account by collecting NCE per exposure.

In the defect detecting algorithm, both global and local processing parameters under which the hot spots are processed (e.g., imaged or etched onto a substrate) are determined. Such parameters may include, for example, laser bandwidth, focus, dose, source parameters, projection optics parameters, and the spatial or temporal variations of these parameters. Alternately, processing parameters may be inferred from metrology data. For example, metrology may include inspecting a substrate using a diffractive tool (e.g., an ASML YieldStar tool), an electron microscope (e.g., ASML's ePfm5 system), or other suitable inspection tools. It is possible to obtain processing parameters for any location on a processed substrate, including the identified hot spots.

In step 212, existence, probability of existence, a characteristic, or a combination thereof, of a defect at a hot spot is determined using the processing parameters under which the hot spot is processed. This determination may be simply comparing the processing parameters and the process window of the hot spot—if the processing parameters fall within the process window, no defect likely exists; if the processing parameters fall outside the process window, at least one defect is predicted to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations. Machine learning techniques may be used to improve the operation of the algorithm.

In one example of a machine learning technique, processing parameters are an input to a classification model. The processing parameters 310 may be used as input (e.g., independent variables) to a classification model 312. The processing parameters 310 may include characteristics of the source (e.g., intensity, pupil profile, etc.), characteristics of the projection optics, dose, focus, characteristics of the resist, characteristics of development and post-exposure baking of the resist, and characteristics of etching. The term "classifier" or "classification model" sometimes also refers to the mathematical function, implemented by a classification algorithm, that maps input data to a category. In machine learning and statistics, classification is the problem of identifying to which of a set of categories 314 (sub-populations) a new observation belongs, on the basis of a training set of data containing observations (or instances) whose category membership is known. These observations may be made separately from the ordinary manufacturing process purely for the purpose of providing training data, or they may comprise measured data from manufacturing and the category membership assigned, for example by a human operator. The individual observations are analyzed into a set of quantifiable properties, known as various explanatory variables, features, etc. These properties may variously be categorical (e.g. "good"—a lithographic process that does not produce defects or "bad"—a lithographic process that produces defects; "type 1," "type 2," . . . "type n"—different types of defects). Classification is considered an instance of supervised learning, i.e. learning where a training set of correctly identified observations is available. Examples of classification models are, logistic regression and multinomial logit, probit regression, the perceptron algorithm, support vector machines, import vector machines, and linear discriminant analysis.

Figure 4:
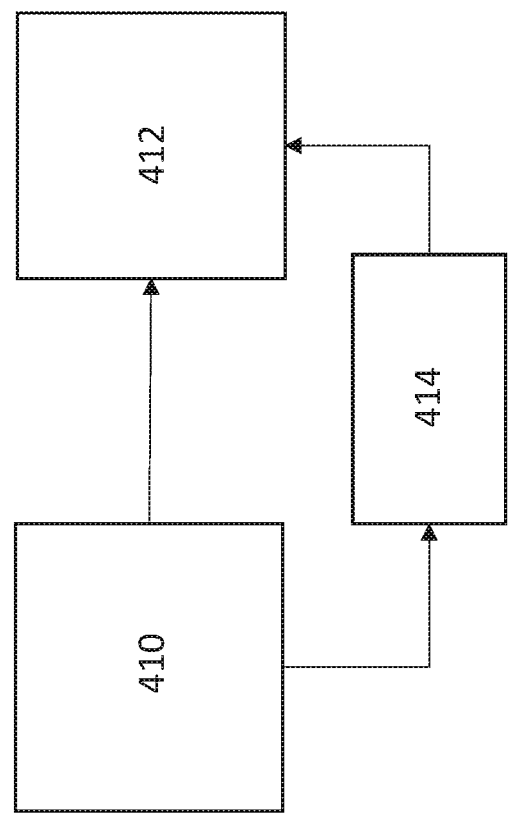
FIG. 4 schematically shows a lithography system working in conjunction with a metrology system in accordance with an embodiment.

FIG. 4 schematically shows a lithography system 410 which transfers exposed wafers to a metrology system 412. The lithography system 410 further passes NCE per exposure information to the defect detection algorithm 414. The defect detection algorithm 414 passes on a list of locations of likely defects (the hot spot list or map) to the metrology system 412.

Figure 5:
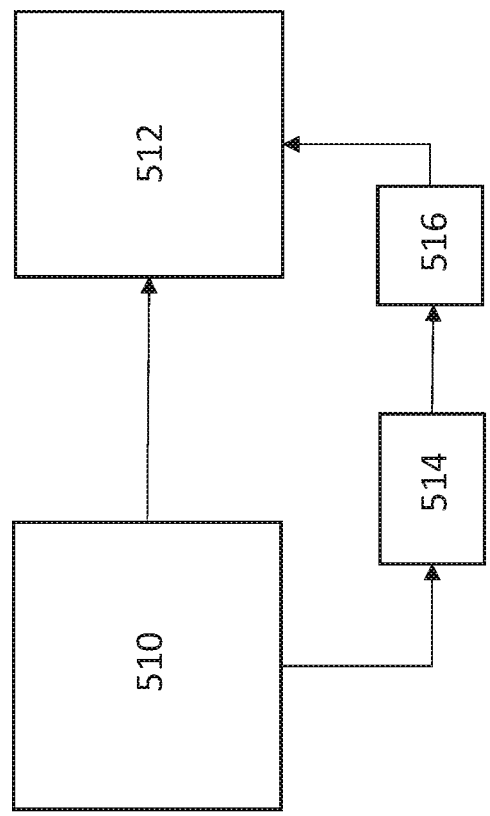
FIG. 5 schematically shows a lithography system working in conjunction with a metrology system in accordance with an embodiment.

FIG. 5 is similar, in that lithography system 510 likewise passes exposed wafers to a metrology system 512. It also passes information on job settings, including information about the mask and illumination source, for example, to a projection lens heating model 514. The projection lens heating model 514 sends information about NCE resulting from projection lens heating to the defect detection algorithm 516. The defect detection algorithm in turn passes on a list of hot spot locations to the metrology system 512.

The embodiments may further be described using the following clauses:

1. A method for predicting a defect location for subsequent scanning by a scanning electron microscope (SEM), the method comprising:
   obtaining non-correctable error information, the non-correctable error information being based on data from a photolithography system used to image a wafer to be scanned by the SEM;
   predicting a defect location on the wafer based on the non-correctable error information; and
   sending the predicted defect location for delivery to the SEM.
2. The method of clause 1, wherein the non-correctable error information is obtained for each exposure.
3. The method of clause 1 or clause 2, wherein the predicting comprises using a defect detection algorithm comprising a computational model of the image based on process parameters of a process used to produce the image and on layout parameters of the image.
4. The method of clause 3, wherein the defect detection algorithm uses machine learning.
5. The method of any of clauses 1-4, wherein the non-correctable error information is an output of the photolithography system.
6. The method of any of clauses 1-5, wherein the non-correctable error information comprises aberration information including spherical aberration information and non-spherical aberration information.
7. The method of any of clauses 1-6, wherein the non-correctable error information comprises lens heating information.
8. The method of clause 7, wherein the lens heating information is used to predict critical dimension or edge placement errors.
9. The method of clause 1, wherein the predicting further comprises predicting a location of an imaging error.
10. A method for predicting a defect location for subsequent scanning by a scanning electron microscope (SEM), the method comprising:
   predicting optical imaging effects of heating on optical elements of the projection optical system using a computational projection optical system heating model; and
   predicting a defect location, using the predicted heating effects as an input; and sending the predicted defect location for delivery to the SEM.
11. The method of clause 10, wherein the computational projection optical system heating model receives information regarding a mask used in producing the image and setting information for an illumination source used in producing the image.
12. A system for inspection of a wafer, the wafer having an image produced with a photolithography system including a projection optical system, the system comprising:
   a module configured and arranged to obtain non-correctable error information from the photolithography system; and
   a prediction module, configured and arranged to predict a defect location using a defect detection algorithm, using the non-correctable error information as an input; and a transmission system configured and arranged to send the predicted defect location to an inspection tool.
13. The system of clause 12, wherein the inspection tool is configured and arranged to inspect the wafer using the predicted imaging errors to determine areas of the wafer to be inspected
14. The system of clause 12, wherein the prediction module uses non-correctable error information pertaining to heating effects on optical elements of the projection optical system.
15. The system of clause 14, wherein the heating effects are modeled based on information regarding a mask and an illumination setting used in producing the image.
16. The system of clause 12, wherein the inspection tool is an SEM device coupled to the module, the prediction module and the transmission system, and wherein further the system is an SEM system.
17. A computer program product comprising a computer readable medium having instructions recorded thereon, the instructions when executed by a computer implementing the method of any of clauses 1-11.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A method for predicting a defect location for subsequent scanning by an inspection tool, the method comprising:
   obtaining non-correctable error information, the non-correctable error information being based on data from a photolithography system used to produce an image on a substrate to be inspected by the inspection tool and representing an error that is determined to be non-correctable by the photolithography system;
   predicting a defect location on the substrate by application of the non-correctable error information as an input to a defect detection algorithm; and
   making the predicted defect location available to the inspection tool.
2. The method of claim 1, wherein the non-correctable error information is obtained for each exposure.

3. The method of claim 1, wherein the defect detection algorithm comprises a computational model based on process parameters of a process used to produce the image and on layout parameters of the image.

4. The method of claim 3, wherein the defect detection algorithm uses machine learning.

5. The method of claim 1, wherein the non-correctable error information is an output of the photolithography system.

6. The method of claim 1, wherein the predicting further comprises predicting a location of an error in the image produced by the photolithography system.

7. A system for inspection of a substrate, the substrate having an image produced with a photolithography system including a projection optical system, the system comprising:
- a module configured and arranged to obtain non-correctable error information from the photolithography system, the non-correctable error information representing an error that is determined to be non-correctable by the photolithography system;
- a prediction module configured and arranged to predict a defect location using a defect detection algorithm, using the non-correctable error information as an input to the defect detection algorithm; and
- a transmission system configured and arranged to make the predicted defect location available to an inspection tool.

8. The system of claim 7, wherein the inspection tool is configured and arranged to inspect the wafer using the predicted defect location to determine selected areas of the substrate to be inspected.

9. The system of claim 7, wherein the prediction module uses non-correctable error information pertaining to heating effects on one or more optical elements of the projection optical system.

10. The system of claim 9, wherein the heating effects are modeled based on information regarding a patterning device and an illumination setting used in producing the image.

11. The system of claim 7, wherein the inspection tool is an electron microscope device coupled to the module, the prediction module and the transmission system, and wherein further the system is an electron microscope system.

12. A computer program product comprising a non-transitory computer readable medium having instructions therein, the instructions, upon execution by a computer system, configured to cause the computer system to at least:
- obtain non-correctable error information, the non-correctable error information being based on data from a photolithography system used to produce an image on a substrate to be inspected by an inspection tool and representing an error that is determined to be non-correctable by the photolithography system;
- predict a defect location on the substrate by application of the non-correctable error information as an input to a defect detection algorithm; and
- make the predicted defect location available to the inspection tool for inspecting by the inspection tool.

13. The computer program product of claim 12, wherein the defect detection algorithm comprises a computational model based on process parameters of a process used to produce the image and on layout parameters of the image.

14. The computer program product of claim 13, wherein the defect detection algorithm uses machine learning.

15. The computer program product of claim 12, wherein the non-correctable error information is an output of the photolithography system.

16. The computer program product of claim 12, wherein the non-correctable error information comprises aberration information including spherical aberration information and non-spherical aberration information and/or comprises lens heating information.

17. The computer program product of claim 12, wherein the instructions configured to cause the computer system to predict the defect location are further configured to predict a location of an error in the image produced by the photolithography system.

18. The computer program product of claim 12, wherein the non-correctable error information comprises aberration information including spherical aberration information and non-spherical aberration information.

19. The computer program product of claim 12, wherein the non-correctable error information comprises lens heating information.

20. The computer program product of claim 19, wherein the lens heating information is used by the defect detection algorithm to predict critical dimension or edge placement errors.

* * * * *